United States Patent
Alvandpour et al.

(10) Patent No.: US 6,919,737 B2
(45) Date of Patent: Jul. 19, 2005

(54) VOLTAGE-LEVEL CONVERTER

(75) Inventors: Atila Alvandpour, Portland, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 10/010,737

(22) Filed: Dec. 7, 2001

(65) Prior Publication Data

US 2003/0107404 A1 Jun. 12, 2003

(51) Int. Cl.$^7$ .......................................... H03K 19/0175
(52) U.S. Cl. .............................. 326/81; 326/68; 326/80
(58) Field of Search .............................. 326/68, 80, 81, 326/104, 112, 119, 121

(56) References Cited

U.S. PATENT DOCUMENTS

| | | | | | |
|---|---|---|---|---|---|
| 5,027,007 A | * | 6/1991 | LaRue et al. | ............... | 307/443 |
| 5,115,434 A | * | 5/1992 | Aizaki | ........................ | 307/475 |
| 5,610,544 A | * | 3/1997 | Aoki | ........................... | 327/198 |
| 6,249,145 B1 | * | 6/2001 | Tanaka et al. | ................ | 326/68 |

* cited by examiner

Primary Examiner—Anh Q. Tran
(74) Attorney, Agent, or Firm—Schwegman, Lundberg, Woessner & Kluth, P.A.

(57) ABSTRACT

A voltage-level converter and a method of converting a first logic voltage level to a second logic voltage level are described. In one embodiment, a voltage-level converter connects a first logic unit connected to a first supply voltage to a second logic unit connected to a second supply voltage. The voltage-level converter includes at least one transistor connected to the second supply voltage. The at least one transistor has a threshold voltage whose absolute value is greater-than-or-about-equal to the absolute value of the difference between the second supply voltage and the first supply voltage. In an alternative embodiment, a method for converting a first logic voltage level to a second logic voltage level includes transmitting a logic signal from a logic unit having an output voltage swing of between a first voltage level and a second voltage level, receiving the logic signal at a logic circuit having a pull-up transistor and an output voltage swing between a third voltage level and a fourth voltage level, and turning off the pull-up transistor when the logic signal has a value slightly greater than the difference between the third voltage level and the first voltage level.

9 Claims, 7 Drawing Sheets

VOLTAGE-LEVEL CONVERTER

FIELD

This invention relates to integrated circuits and, more particularly, to integrated circuit voltage-level converters.

BACKGROUND

A voltage-level converter converts a logic signal at a first voltage level to a logic signal at a second voltage level. In a modem integrated circuit, such as a microprocessor, a digital signal processor, or an application specific integrated circuit, different voltage levels, such as a first supply voltage level and a second supply voltage level, provide power to different groups of circuits to reduce the overall power consumption in the integrated circuit. However, signals generated by circuits powered at a first supply voltage level are usually incompatible with circuits powered at a second supply voltage level. Therefore, signals generated by circuits powered at a first supply voltage level are converted to signals compatible with circuits powered at a second supply voltage level by inserting a voltage-level converter between the circuits powered at the first supply voltage level and the circuits powered at the second supply voltage level.

FIG. 1A is a schematic diagram of a prior art voltage-level converter 100. The voltage-level converter 100 includes transistors 102–105 having threshold voltages that are about equal. The voltage-level converter 100 converts a logic signal at a first logic voltage level ($V_{CC1}$) at the node 107 to a logic signal at a second logic voltage level ($V_{CC2}$) at the node 109. Unfortunately, if the logic signal at the first logic voltage level ($V_{CC1}$) does not cause the transistor 102 to enter the cut-off region of operation, the conversion of a logic signal from the first logic voltage level ($V_{CC1}$) at node 107 to the second logic voltage level ($V_{CC2}$) at node 109 can cause the voltage-level converter to consume power. Furthermore, as the difference between the first voltage level ($V_{CC1}$) and the second voltage level ($V_{CC2}$) increases, the voltage-level converter 100 increases its static power consumption. Thus, even though the voltage-level converter 100 provides relatively fast voltage level conversion when compared with other voltage-level converters, the voltage-level converter 100 can consume power for static inputs and is not well suited for applications that require low power consumption.

FIG. 1B is a schematic diagram of a prior art voltage-level converter 110. The voltage-level converter 110 includes transistors 114–117 and inverter 119. The transistors 114–117 have threshold voltages that are about equal. After a low-to-high voltage transition at the input node 112, the first cross-coupled pull-up transistor 114 is turned off, the second cross-coupled pull-up transistor 115 is turned on, the transistor 116 is turned on, and the transistor 117 is turned off. With the transistors 114 and 117 turned off, there is no direct current path through the voltage-level converter 110, and the voltage-level converter 110 consumes substantially zero power. However, during a low-to-high voltage transition at the input node 112, there is contention at nodes 122 and 124, and this contention increases the delay and the dynamic power consumption of the voltage-level converter 110.

Therefore, even though the voltage-level converter 110 consumes substantially zero power for static voltage level inputs, the performance (speed) of the voltage-level converter 110 is relatively low, and the voltage-level converter 110 consumes power during voltage transitions.

For these and other reasons there is a need for the present invention.

DESCRIPTION

Figure 1A:
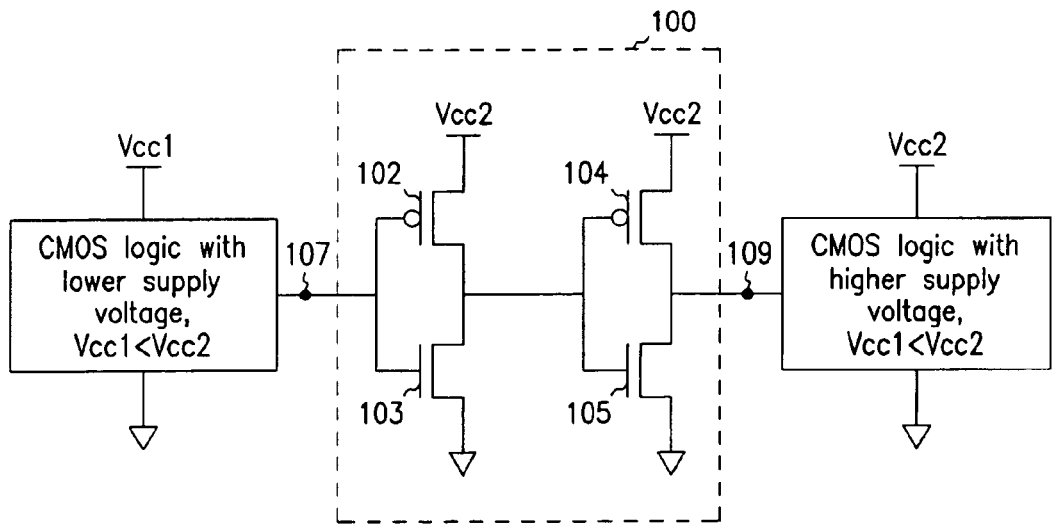
FIG. 1A is a schematic diagram of a prior art voltage-level converter.
Figure 1B:
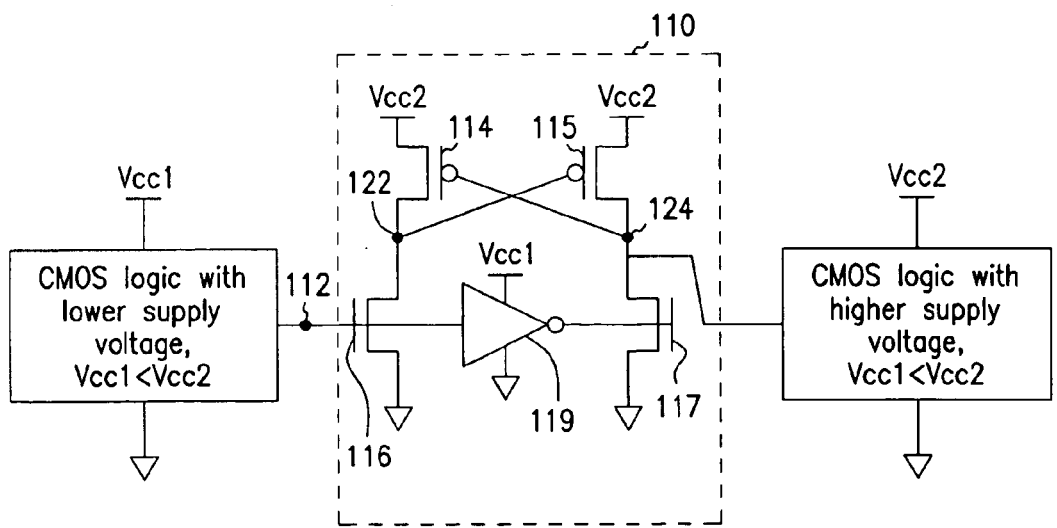
FIG. 1B is a schematic diagram of an alternative prior art voltage-level converter.

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

Figure 2A:
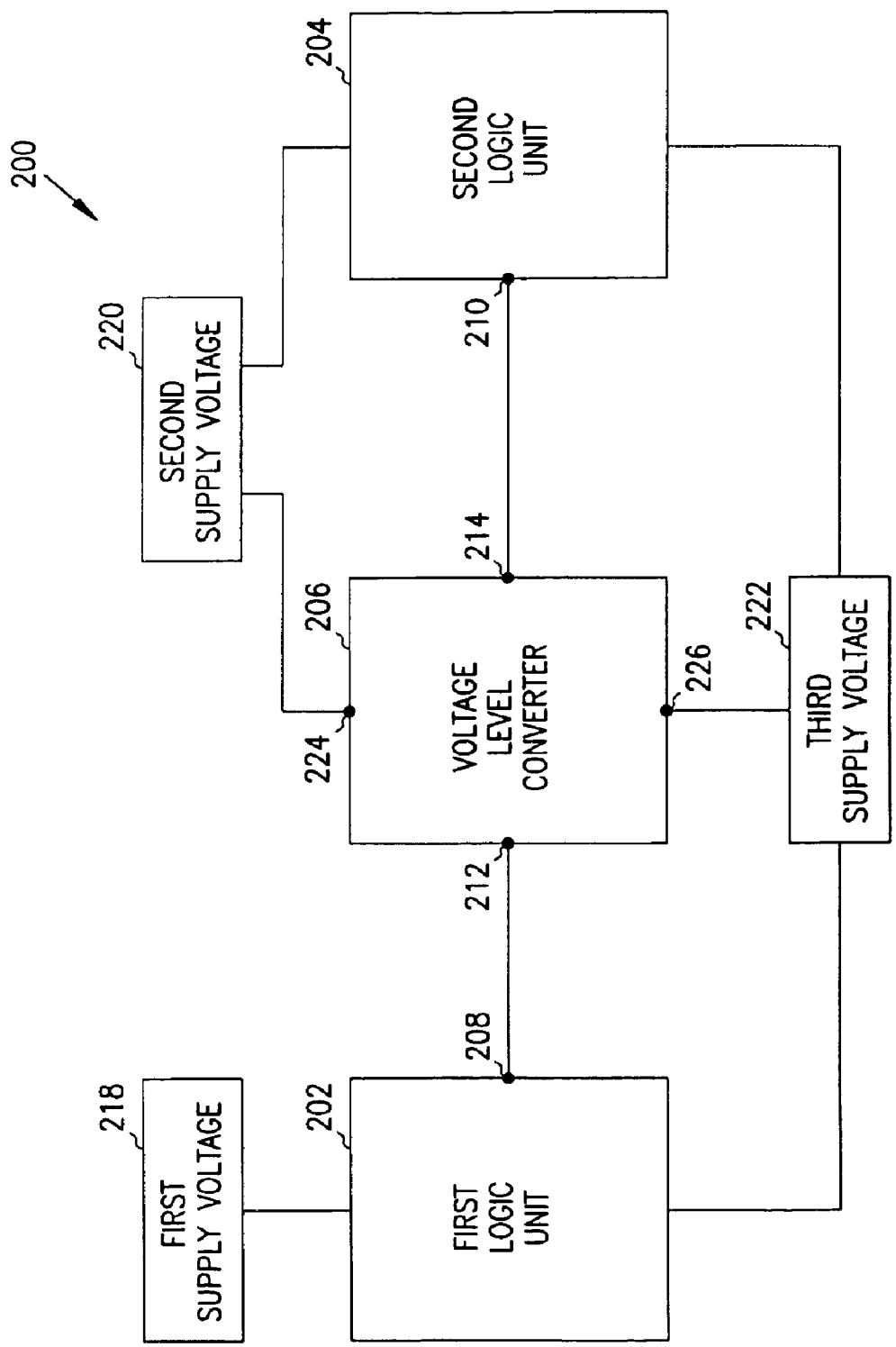
FIG. 2A is a block diagram of some embodiments of a logic unit including a voltage-level converter according to the teachings of the present invention.

FIG. 2A is a block diagram of some embodiments of a logic unit 200 according to the teachings of the present invention. The logic unit 200 includes a first logic unit 202, a second logic unit 204, and a voltage-level converter 206. The first logic unit 202 includes an output port 208, the second logic unit 204 includes an input port 210, and the voltage-level converter 206 includes an input port 212 and an output port 214. The output port 208 of the first logic unit 202 is coupled to the input port 212 of the voltage-level converter 206 and the output port 214 of the voltage-level converter 206 is coupled to the input port 216 of the second logic unit 204. Power is provided to the logic unit 200 by a first supply voltage 218, a second supply voltage 220, and a third supply voltage 222. The first logic unit 202 is connected to the first supply voltage 218 and the third supply voltage 222, the second logic unit 204 is connected to the second supply voltage 220 and the third supply voltage 222, and the voltage-level converter 206 is connected to the second supply voltage 220 and the third supply voltage 222.

In one embodiment, the first supply voltage 218 has a positive potential, the second supply voltage 220 has a positive potential greater than the positive potential of the first supply voltage 218, and the third supply voltage 222 has a zero or negative potential.

The first logic unit 202 includes one or more logic or storage devices for performing a logical function. Exemplary logic devices include AND gates, OR gates, NAND gates, NOR gates, and XOR gates. Exemplary storage devices include memory devices such as dynamic random access memory devices and core storage devices. The first logic unit 202 is not limited to being fabricated using a particular semiconductor technology. In one embodiment, the first logic unit 202 is fabricated using a complimentary metal-oxide semiconductor process.

The second logic unit 204 includes one or more logic or storage devices for performing a logical function. The second logic unit can include critical functional units and/or critical circuit paths. A critical functional unit is a functional unit, such as an arithmetic and logic unit, that is designed to perform a logical operation as fast as possible. A critical circuit path is a circuit path, such as a clock path found in a clock distribution unit, that is designed to transmit signals as fast as possible along the path. Exemplary logical units include AND gates, OR gates, NAND gates, NOR gates, and XOR gates. Exemplary storage devices include static random access memory devices and electrically programmable read-only memory devices. The second logic unit 204 is not limited to being fabricated using a particular technology. In one embodiment, the second logic unit 204 is fabricated using a complimentary metal-oxide semiconductor process. In an alternative embodiment, the second logic unit 204 is fabricated using a bipolar process.

The voltage-level converter 206 is connected to the second supply voltage 220 at a node 224 and to the third supply voltage 222 at a node 226. In operation, the voltage-level converter 206 receives an input signal at an input port 212, processes the input signal, and provides an output signal at an output port 214.

Figure 2B:
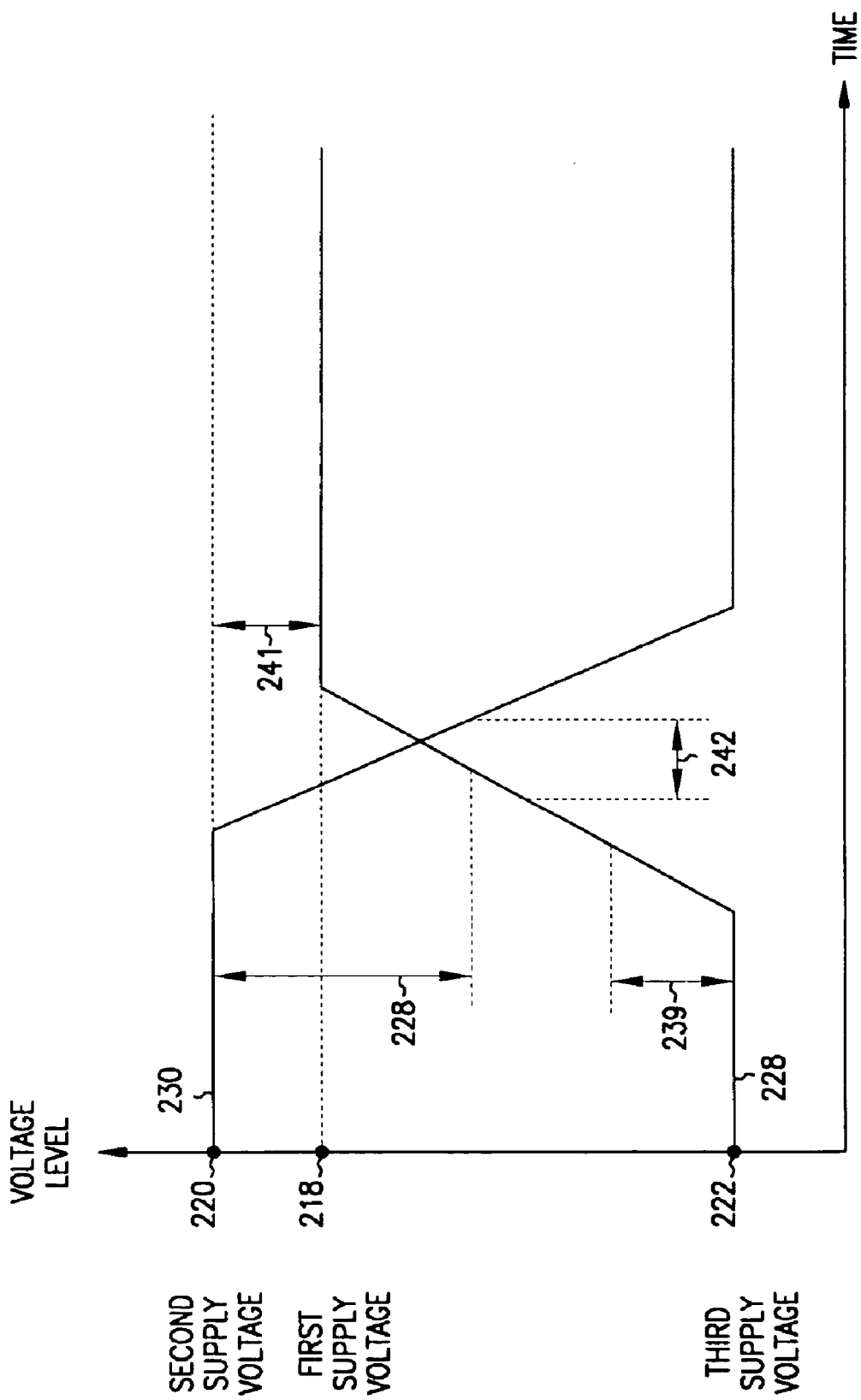
FIG. 2B is a sketch of an exemplary input signal received at an input port of a voltage-level converter shown in FIG. 2A and an output signal produced by the voltage-level converter in response to the input signal according to the teachings of the present invention.

FIG. 2B is a sketch of an exemplary input signal 228 received at an input port 212 (shown in FIG. 2A) of the voltage-level converter 206 (shown in FIG. 2A) and an output signal 230 (shown in FIG. 2A) produced by the voltage-level converter 206 in response to the exemplary input signal 228. The exemplary input signal 228 and the output signal 230 are described in more detail in the FIG. 2C description provided below.

Figure 2C:
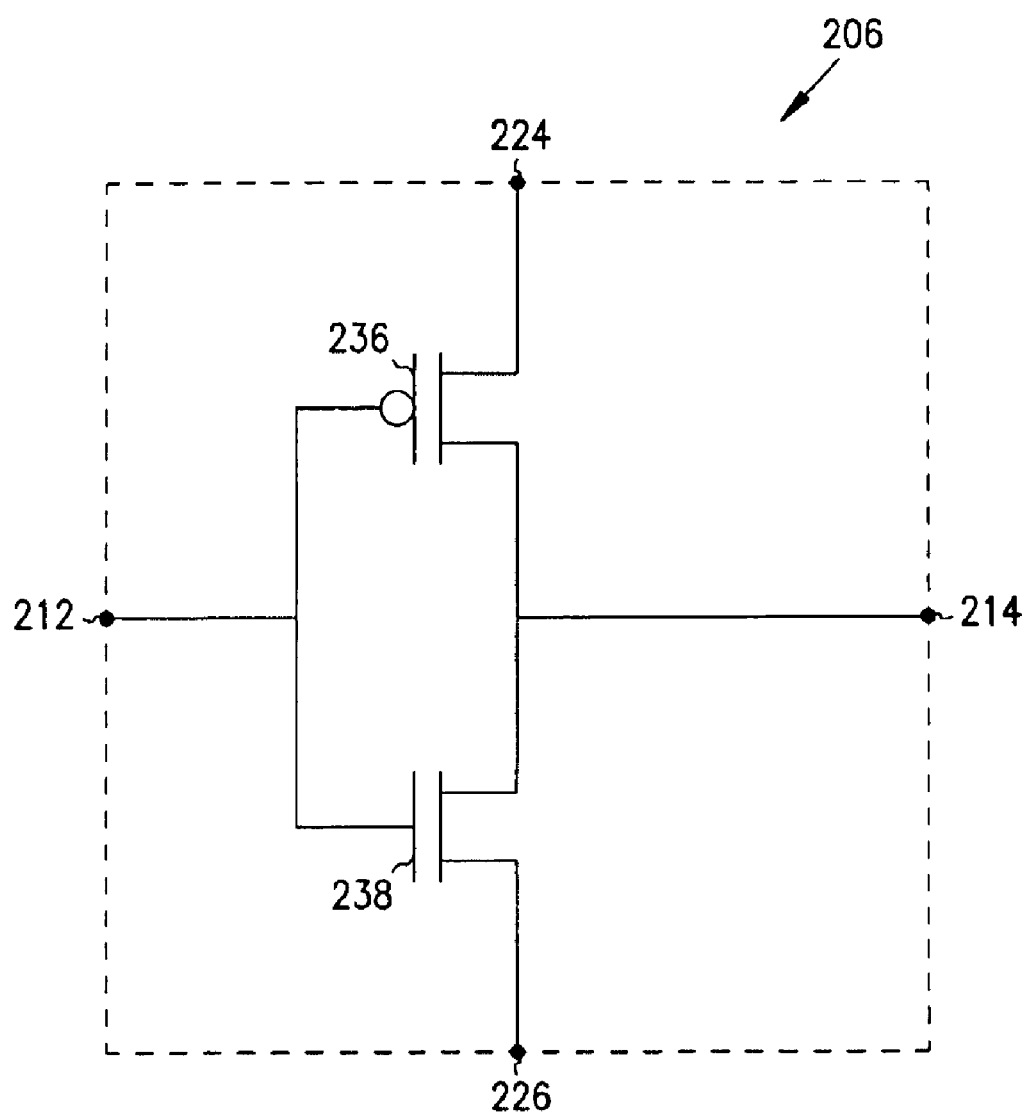
FIG. 2C is a schematic diagram of one embodiment of the voltage-level converter shown in FIG. 2A according to the teachings of the present invention.

FIG. 2C is a schematic diagram of one embodiment of the voltage-level converter 206 shown in FIG. 2A. The voltage-level converter 206 includes an insulated gate p-type field-effect transistor 236 and an insulated gate n-type field-effect transistor 238. The gate of the insulated gate p-type field-effect transistor 236 and the gate of the insulated gate n-type field-effect transistor 238 are coupled together to form the input port 212 of the voltage-level converter 206. A drain/source of the insulated gate p-type field-effect transistor 236 and a drain/source of the insulated gate n-type field-effect transistor 238 are coupled together to serially couple the insulated gate p-type field-effect transistor 236 to the insulated gate n-type field-effect transistor 238. A drain/source of the insulated gate p-type field-effect transistor 236 forms the node 224. A drain/source of the insulated gate n-type field-effect transistor 238 forms the node 226. As configured in FIG. 2C, the insulated gate p-type field-effect transistor 236 and the insulated gate n-type field-effect transistor 238 perform a logical inversion function (i.e., a logical one is converted to a logical zero, and a logical zero is converted to a logical one).

Preferably, the insulated gate n-type field-effect transistor 238 has a threshold voltage 239 (shown in FIG. 2B) that is slightly greater than the third supply voltage 222 (shown in FIG. 2B). In one embodiment, the insulated gate p-type field-effect transistor 236 has a threshold voltage 240 (shown in FIG. 2B) having an absolute value that is about equal to a difference voltage 241 (shown in FIG. 2B). The difference voltage 241 is the difference between the second supply voltage 220 (shown in FIG. 2B) and the first supply voltage 218 (shown in FIG. 2B). In an alternative embodiment, the insulated gate p-type field-effect transistor 236 has a threshold voltage 240 having an absolute value that is greater than the difference voltage 241.

Setting the threshold voltage 240 of the insulated gate p-type field-effect transistor 236 to a value greater than or equal to the difference between the second supply voltage 220 and the first supply voltage 218 permits the insulated gate p-type field-effect transistor 236 to completely turn off for a signal at the input port 212 having a value about equal to the first supply voltage 218. Thus, for a static input signal at the input port 212 substantially zero current flows through the voltage-level converter 206 and between the second supply voltage 220 (shown in FIG. 2A) and the third supply voltage 222 (shown in FIG. 2A). Also, substantially zero power is consumed for the input signal at the input port 212 of the voltage-level converter 206 about equal to the first supply voltage 218 (shown in FIG. 2A). Furthermore, a level conversion delay time 242 (shown in FIG. 2B) is short. Therefore, utilizing an extraordinary high-threshold p-type filed-effect transistor 236 results in a fast and low power voltage level conversion.

Figure 2D:
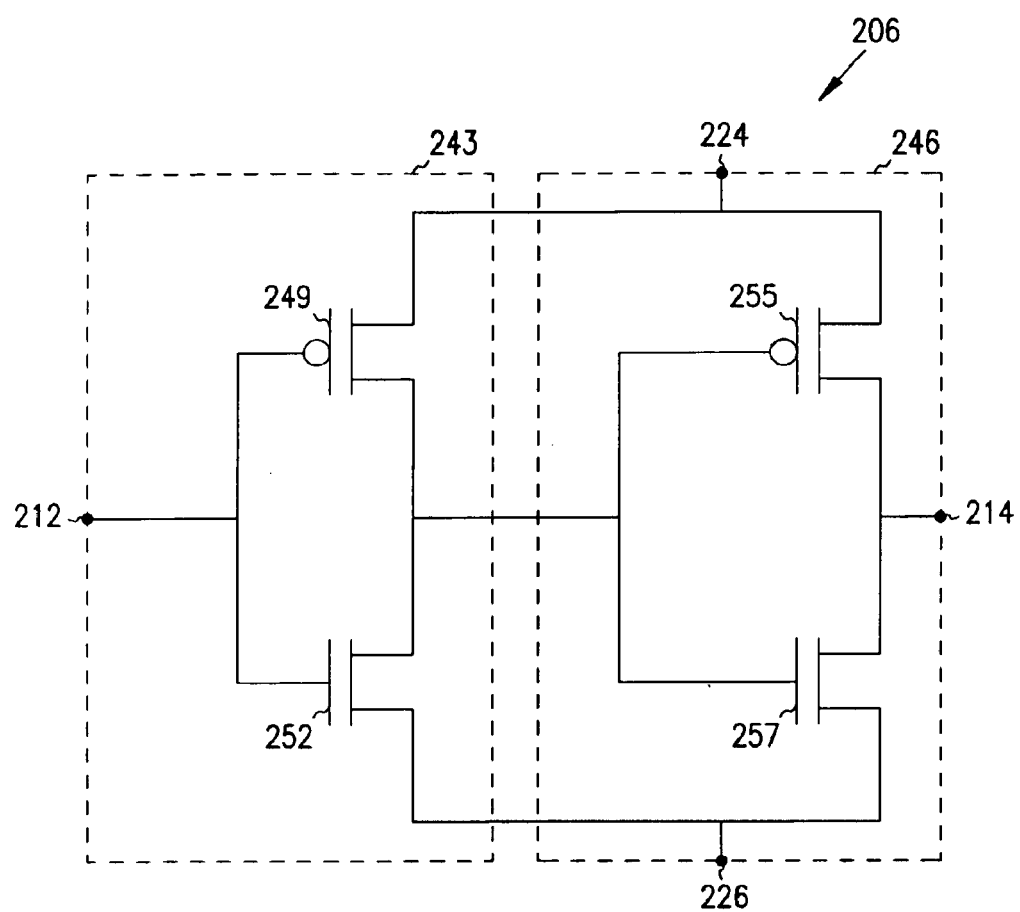
FIG. 2D is a schematic diagram of an alternative embodiment of the voltage-level converter shown in FIG. 2A according to the teachings of the present invention.

FIG. 2D is a schematic diagram of an alternative embodiment of the voltage-level converter 206 shown in FIG. 2A. The voltage-level converter 206 includes a first inverter 243 serially coupled to a second inverter 246. The first inverter 243 includes an insulated gate p-type field-effect transistor 249 and an insulated gate n-type field-effect transistor 252. The gate of the insulated gate p-type field-effect transistor 249 and the gate of the insulated gate n-type field-effect transistor 252 are coupled together to form the input port 212. A drain/source of the insulated gate p-type field-effect transistor 249 and a drain/source of the insulated gate n-type field effect transistor 252 are coupled together to serially couple the insulated gate p-type field-effect transistor 249 to the insulated gate n-type field-effect transistor 252.

The second inverter 246 includes an insulated gate p-type field-effect transistor 255 and an insulated gate n-type field-effect transistor 257. The gate of the insulated gate p-type field-effect transistor 255 and the gate of the insulated gate n-type field-effect transistor 257 are coupled to a drain/source of the insulated gate p-type field effect transistor 249 and to a drain/source of the insulated gate n-type field effect transistor 252. A drain/source of the insulated gate p-type field-effect transistor 255 and a drain/source of the insulated gate n-type field effect transistor 257 are coupled together to serially couple the insulated gate p-type field-effect transistor 255 to the insulated gate n-type field-effect transistor 257. A drain/source of the insulated gate p-type field-effect transistor 249 is coupled to a drain/source of the insulated gate p-type field-effect transistor 255 to form the node 224, and a drain/source of the insulated gate n-type field-effect transistor 252 is coupled to a drain/source of the insulated gate n-type field-effect transistor 257 to form the node 226.

As configured in FIG. 2D, the first inverter 243 and the second inverter 246 perform a voltage-level conversion without logical inversion (i.e., a logical one is voltage-level converted and remains a logical one, and a logical zero is voltage-level converted and remains a logical zero).

Preferably, the threshold voltage of the insulated gate n-type field-effect transistor 252, the threshold voltage of the insulated gate p- type field-effect transistor 255, and the threshold voltage of the insulated gate n-type field-effect transistor 257 are about equal. In one embodiment, the threshold voltages of the insulated gate n-type field-effect transistor 252, the threshold voltage of the insulated gate p-type field-effect transistor 255, and the threshold voltage of the insulated gate n-type field-effect transistor 257 are about equal to 0.3 volts. In one embodiment, the threshold voltage of the insulated gate p-type field-effect transistor 249 has an absolute value that is about equal to the difference between the second supply voltage 220 (shown in FIG. 2A) and the first supply voltage 218 (shown in FIG. 2A). In an alternative embodiment, the threshold voltage of the insulated gate p-type field-effect transistor 249 has an absolute value that is greater than the difference between the second supply voltage 220 and the first supply voltage 218. Setting the threshold voltage of the insulated gate p-type field-effect transistor 249 to a value such that the absolute value of the threshold voltage is greater-than-or-equal to the difference between the second supply voltage 220 and the first supply voltage 218 permits the insulated gate p-type field-effect transistor 249 to completely turn off for a signal at the input port 212 having a value about equal to the first supply voltage 218. Thus, for a static input signal substantially zero current flows between the second supply voltage 220 and the third supply voltage 222 in the voltage-level converter 206, and substantially zero power is consumed after the input voltage at the input port 212 of the voltage-level converter 206 is about equal to the voltage of the first supply voltage 218.

The voltage-level converter 206 shown in FIG. 2D includes the first inverter 243 which consumes substantially zero power for a high-level input voltage because the insulated gate p-type field effect transistor 249 is completely turned off. The second inverter 246, in this embodiment, provides improved drive capability when compared with the voltage-level converter 206 shown in FIG. 2C. Thus, the second inverter 246 is capable of driving a large number of loads or a large capacitance without a significant decrease in speed. Further, the two inverters 243 and 246 together provide a non-inverting buffer, which generates a level converted signal with the same polarity as an input signal at the input port 212.

Figure 2E:
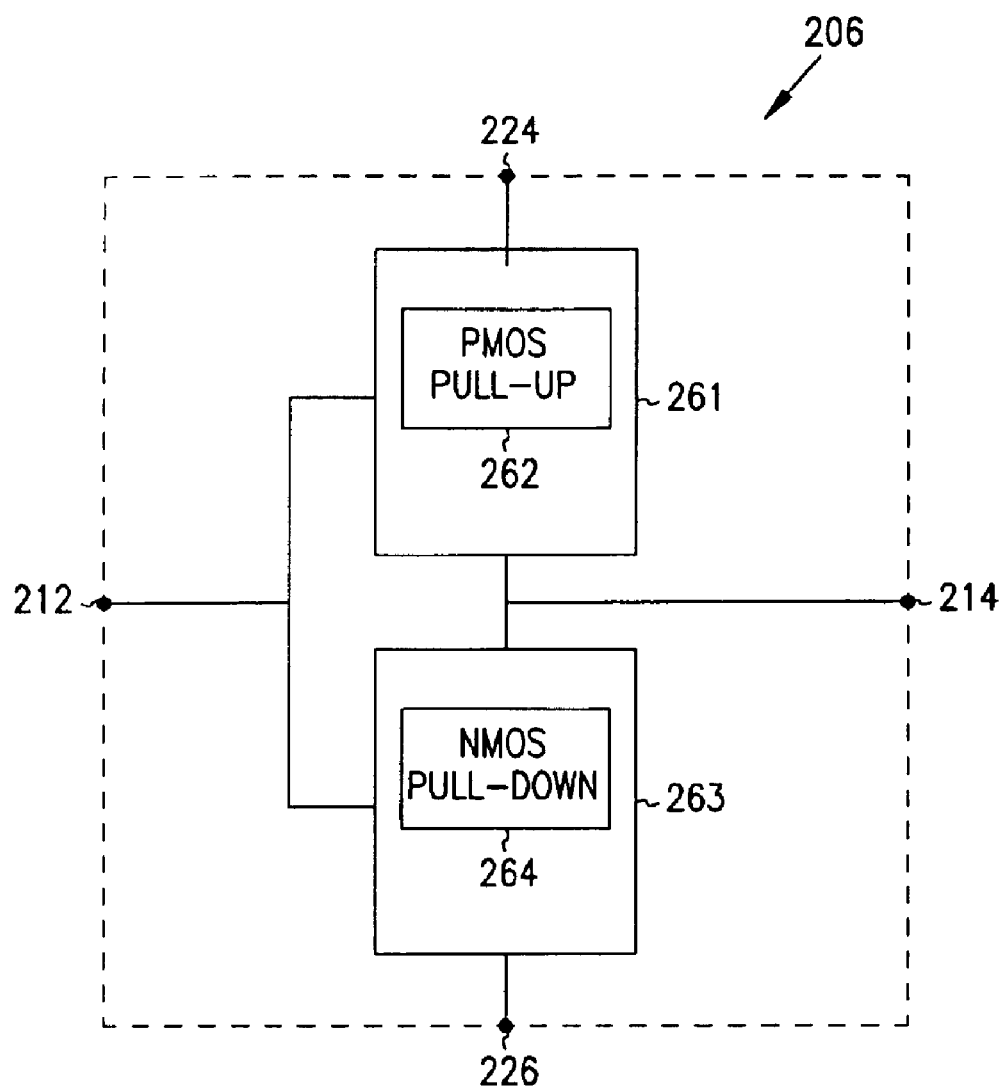
FIG. 2E is a block diagram of another alternative embodiment of the voltage-level converter shown in FIG. 2A according to the teachings of the present invention.

FIG. 2E is a block diagram of another alternative embodiment of the voltage-level converter 206 shown in FIG. 2A. The voltage-level converter 206 includes a logic circuit 261 having a p-type metal-oxide semiconductor (PMOS) pull-up transistor 262 and a logic circuit 263 having an NMOS pull-down transistor 264. The logic circuit 261 is serially connected to the logic circuit 263. The serial connection forms the output port 214. The input port of the logic circuit 261 and the input port of the logic circuit 263 are coupled together to form the input port 212. The input port 212 is illustrated as a single connection, however the input port 212 is not limited to a single connection. A plurality of inputs signals can be received at input port 212 and provided to the logic circuits 261 and 263. In operation, the logic circuits 261 and 263 cooperate to provide a single logic function. The logic function provided by circuits 261 and 263 is not limited to a particular logic function. Exemplary logic functions include AND, OR, NAND, NOR, and XOR.

In one embodiment, p-type metal-oxide semiconductor (PMOS) pull-up transistor 262 is an insulated gate p-type field-effect transistor. In one embodiment, the threshold voltage of the p-type metal-oxide semiconductor (PMOS) pull-up transistor 262 is about equal to the difference between the second supply voltage 200 (shown in FIG. 1A) and the first supply voltage 218 (shown in FIG. 1A). In an alternative embodiment, the threshold voltage of the p-type metal-oxide semiconductor (PMOS) pull-up transistor 262 is greater than the difference between the second supply voltage 200 and the first supply voltage 218. As configured in FIG. 2E, the voltage-level converter 206 performs a voltage-level conversion and a logic function, such as an AND, OR, NAND, NOR, or XOR. Thus, by utilizing the suggested condition for an appropriate high threshold voltage PMOS transistor in the logic circuit 261, a logic block can perform logic as well as a fast, low power level conversion at the same time. This in turn results also in a significant area saving since there is no need for an explicit level converter such as provided in FIGS. 2C and 2D.

Figure 3:
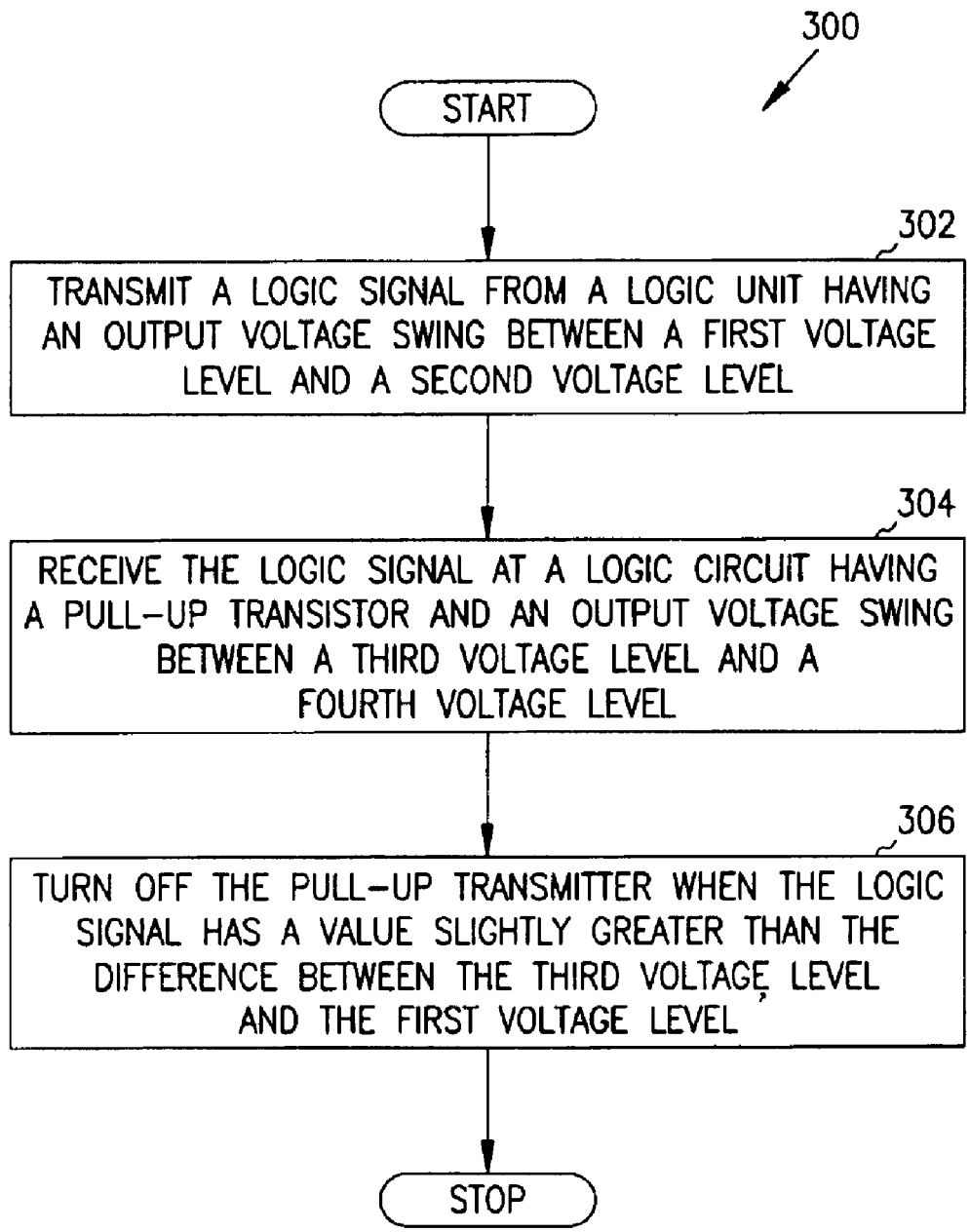
FIG. 3 is a flow diagram of one embodiment of a method for converting a signal having a first voltage swing to a signal having a second voltage swing according to the teachings of the present invention.

FIG. 3 is a flow diagram of one embodiment of a method 300 for converting a signal having a first voltage swing to a signal having a second voltage swing according to the teachings of the present invention. In one embodiment, the first voltage swing is less than the second voltage swing. The method 300 includes the operations of transmitting a logic signal (block 302), receiving a logic signal (block 304), and turning off a pull-up transistor (block 306). Transmitting a logic signal includes a transmitting a logic signal from a logic unit having an output voltage swing between the first voltage level and a second voltage level as shown in block 302. Receiving a logic signal includes receiving a logic signal and a logic circuit having a pull-up transistor and an output voltage swing between the third voltage level and a fourth voltage level as shown in block 304. Turning off a pull up transistor includes turning off the pull-up transistor when the logic signal has a value slightly greater than the difference between the third voltage level as shown in block 306. In one embodiment, the first voltage level is greater than the second voltage level, the third voltage level is greater than the fourth voltage level, and the third voltage level is greater than the first voltage level. In an alternative embodiment, the first voltage level is greater than the second voltage level, the third voltage level is greater than the fourth voltage level, and the third voltage level is about equal to the first voltage level.

In the embodiments described above, reference is made to the value of the threshold voltage of one or more transistors. Those skilled in the art will appreciate that many factors affect the threshold voltage in a transistor and many methods are available for controlling the value of the threshold voltage. In one such method, charge is implanted under the gate of the transistor to control the threshold voltage.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:
1. A logic unit comprising:
   a first logic unit connected to a first supply voltage;
   a second logic unit connected to a second supply voltage; and a logic circuit connecting the first logic unit to the second logic unit, the logic circuit including at least one transistor having a threshold voltage greater than or about equal to the difference between the second supply voltage and the first supply voltage and the at least one transistor connected to the second supply voltage, wherein the logic circuit comprises an AND circuit.

2. A logic unit comprising:

a first logic unit connected to a first supply voltage;

a second logic unit connected to a second supply voltage; and a logic circuit connecting the first logic unit to the second logic unit, the logic circuit including at least one transistor having a threshold voltage greater than or about equal to the difference between the second supply voltage and the first supply voltage and the at least one transistor connected to the second supply voltage, wherein the logic circuit comprises a NAND circuit.

3. A logic unit comprising:

a first logic unit connected to a first supply voltage;

a second logic unit connected to a second supply voltage; and a logic circuit connecting the first logic unit to the second logic unit, the logic circuit including at least one transistor having a threshold voltage greater than or about equal to the difference between the second supply voltage and the first supply voltage and the at least one transistor connected to the second supply voltage, wherein the logic circuit comprises an OR circuit.

4. A logic unit comprising:

a first logic unit connected to a first supply voltage;

a second logic unit connected to a second supply voltage; and a logic circuit connecting the first logic unit to the second logic unit, the logic circuit including at least one transistor having a threshold voltage greater than or about equal to the difference between the second supply voltage and the first supply voltage and the at least one transistor connected to the second supply voltage, wherein the logic circuit comprises a NOR circuit.

5. A logic unit comprising:

a first logic unit connected to a first supply voltage;

a second logic unit connected to a second supply voltage; and a logic circuit connecting the first logic unit to the second logic unit, the logic circuit including at least one transistor having a threshold voltage greater than or about equal to the difference between the second supply voltage and the first supply voltage and the at least one transistor connected to the second supply voltage, wherein the logic circuit comprises an XOR circuit.

6. A logic unit comprising:

a first logic unit connected to a first supply voltage;

a second logic unit connected to a second supply voltage; and a logic circuit connecting the first logic unit to the second logic unit, the logic circuit including at least one transistor having a threshold voltage greater than or about equal to the difference between the second supply voltage and the first supply voltage and the at least one transistor connected to the second supply voltage, wherein the second logic unit comprises a clock distribution circuit and the logic circuit comprises a NAND circuit.

7. A logic unit comprising:

a first logic unit connected to a first supply voltage;

a second logic unit connected to a second supply voltage; and a logic circuit connecting the first logic unit to the second logic unit, the logic circuit including at least one transistor having a threshold voltage greater than or about equal to the difference between the second supply voltage and the first supply voltage and the at least one transistor connected to the second supply voltage, wherein the second logic unit comprises a clock distribution circuit and the logic circuit comprises a NOR circuit.

8. A logic unit comprising:

a first logic unit connected to a first supply voltage;

a second logic unit connected to a second supply voltage; and a logic circuit connecting the first logic unit to the second logic unit, the logic circuit including at least one transistor having a threshold voltage greater than or about equal to the difference between the second supply voltage and the first supply voltage and the at least one transistor connected to the second supply voltage, wherein the second logic unit comprises an arithmetic unit and the logic circuit comprises an OR circuit.

9. A logic unit comprising:

a first logic unit connected to a first supply voltage;

a second logic unit connected to a second supply voltage; and a logic circuit connecting the first logic unit to the second logic unit, the logic circuit including at least one transistor having a threshold voltage greater than or about equal to the difference between the second supply voltage and the first supply voltage and the at least one transistor connected to the second supply voltage, wherein the second logic unit comprises an arithmetic unit and the logic circuit comprises an XOR circuit.

* * * * *